(12) United States Patent
Barrows et al.

(10) Patent No.: US 7,949,978 B2
(45) Date of Patent: *May 24, 2011

(54) STRUCTURE FOR SYSTEM ARCHITECTURES FOR AND METHODS OF SCHEDULING ON-CHIP AND ACROSS-CHIP NOISE EVENTS IN AN INTEGRATED CIRCUIT

(75) Inventors: Corey K. Barrows, Colchester, VT (US); Kenneth J. Goodnow, Essex Junction, VT (US); Stephen G. Shuma, Underhill, VT (US); Peter A. Twombly, Shelburne, VT (US); Paul S. Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 706 days.

This patent is subject to a terminal disclaimer.

(21) Appl. No.: 11/934,804

(22) Filed: Nov. 5, 2007

(65) Prior Publication Data

US 2009/0119625 A1    May 7, 2009

(51) Int. Cl.
*G06F 17/50* (2006.01)
*H03K 19/003* (2006.01)
(52) U.S. Cl. ............................ 716/115; 327/538; 326/33
(58) Field of Classification Search .................. 716/1, 5, 716/115; 327/538; 326/33
See application file for complete search history.

(56) References Cited

U.S. PATENT DOCUMENTS

| 6,072,805 | A | 6/2000 | Molnar et al. |
| 6,675,246 | B1 | 1/2004 | Molnar et al. |
| 2003/0221055 | A1 | 11/2003 | Okada |
| 2004/0034749 | A1 | 2/2004 | Jeddeloh |
| 2004/0046611 | A1 | 3/2004 | Uneme |
| 2007/0283066 | A1 | 12/2007 | Petty |

OTHER PUBLICATIONS

U.S. Appl. No. 11/621,175, filed Jan. 9, 2007, entitled "System Architectures for and Methods of Scheduling On-Chip and Accross-Chip Noise Events," Corey K. Barrows, Kenneth J. Goodnow, Stephen G. Shuma, Peter A. Twombly, Paul S. Zuchowski.
Notice of Allowance dated Feb. 6, 2009, in connection with related U.S. Appl. No. 11/621,175, filed Jan. 9, 2007.
Response to First Office Action dated Dec. 8, 2008 in connection with related U.S. Appl. No. 11/621,175, filed Jan. 9, 2007.
First Office Action dated Jun. 9, 2008 in connection with related U.S. Appl. No. 11/621,175, filed Jan. 9, 2007.

*Primary Examiner* — Paul Dinh
*Assistant Examiner* — Patrick Sandoval
(74) *Attorney, Agent, or Firm* — Downs Rachlin Martin PLLC

(57) ABSTRACT

A design structure integrated circuit (IC) system architectures that allow for the reduction of on-chip or across-chip transient noise budgets by providing a means to avoid simultaneous high current demand events from at least two functional logic blocks, i.e., noise contributors, are disclosed. Embodiments of the IC system architectures include at least one noise event arbiter and at least two noise contributor blocks. A method of scheduling on-chip noise events to avoid simultaneous active transient noise events may include, but is not limited to: the noise event arbiter receiving simultaneously multiple requests-to-operate from multiple noise contributors; the noise event arbiter determining when each noise contributor may execute operations based on a pre-established dI/dt budget; and the noise event arbiter notifying each noise contributor as to when permission is granted to execute its operations.

5 Claims, 6 Drawing Sheets

IC system architecture 10

STRUCTURE FOR SYSTEM ARCHITECTURES FOR AND METHODS OF SCHEDULING ON-CHIP AND ACROSS-CHIP NOISE EVENTS IN AN INTEGRATED CIRCUIT

FIELD OF THE DISCLOSURE

The present disclosure generally relates to the field of integrated circuit transient noise management. In particular, the present disclosure is directed to a design structure for system architectures for and methods of scheduling on-chip and across-chip noise events in an integrated circuit.

BACKGROUND

As advances in integrated circuit technology are achieved, device geometries are shrinking in size and the operating voltages (Vdd) are decreasing. Integrated circuit designers must account for on-chip transient noise when developing integrated circuits, because the lower the operating voltage, the more likely a voltage drop due to an instantaneous current draw event (i.e., a noise event) becomes unacceptable because the functional logic blocks on the integrated circuit may not function reliably. For example, as each of several functional logic blocks is powered up and used, more and more current is drawn and more and more transient noise events occur. There are several contributing factors to the increased need to design more transient-noise-tolerant circuitry, including: (1) the inherent performance increase per technology node is shrinking, therefore there is less performance to offer; (2) the performance drop-off vs. voltage curve is getting steeper with thinner oxides and lower Vdds; (3) the increased overall on-chip density may lead to higher current per unit area, which in turn leads to more noise; and (4) higher operating frequencies limit the capability to satisfy instantaneous current demands from off-chip, which leads to larger magnitude on-chip noise pulses.

Generally, events that create worst-case on-chip transient noise (i.e., high instantaneous current demand or dI/dt, which is the time rate of change of current) occur infrequently. However, the worst case noise scenario must be taken into account during the integrated circuit design process. Typically, a "noise budget" is set, and all facets of the integrated circuit design must take this budget into account, with the goal being to minimize the noise budget. In particular, passive noise limitation techniques exist that typically involve a trade-off of performance or power. In one example, the at-circuit minimum voltage may be reduced when closing timing, which results in reduced performance. In another example, two paths in a timing test may be skewed farther apart, which likewise results in reduced performance. In yet another example, the power supply may be increased in order to keep the at-circuit voltage stable, which undesirably results in higher power consumption. In a further example, decoupling capacitors can be added to the integrated circuit in order to limit supply rail collapse due to transient noise events. This, however, consumes area and power.

Consequently, there is a need to guard band against the above-mentioned problems in order to ensure that multiple logic blocks, which can have simultaneous high current demand events, will function reliably while at the same time maintain optimal performance and optimal power consumption. For these reasons, a need exists for system architectures for and methods of scheduling on-chip and across-chip active noise events in an integrated circuit, in order to avoid simultaneous active transient noise events.

SUMMARY OF THE DISCLOSURE

In one embodiment, the present disclosure is directed to a design structure embodied in a machine readable medium used in a design process for an integrated circuit device. The design structure for the integrated circuit device includes an integrated circuit having a predetermined instantaneous current draw threshold and including: a first functional block provided to perform at least one first predefined operation and including a first request-to-operate signal generator configured to generate a first request-to-operate signal; and a second functional block provided to perform at least one second predefined operation and including a second request-to-operate signal generator configured to generate a second request-to-operate signal; and a noise arbiter in communication with each of the first functional block and the second functional block, the noise arbiter controlling when each of the first functional block and the second functional block will operate as a function of the first request-to-operate signal, the second request-to-operate signal and the predetermined instantaneous current draw threshold.

In another embodiment, the present disclosure is directed to a design structure embodied in a machine readable medium for performing a method of controlling instantaneous current noise in an integrated circuit having a predetermined instantaneous current draw threshold and that includes a plurality of noise contributors each configured to generate a request-to-operate signal and each configured to perform at least one predefined operation. The design structure includes a means for receiving substantially simultaneously a plurality of request-to-operate signals from corresponding ones of the plurality of noise contributors; a means for determining when ones of the plurality of predefined operations corresponding to the corresponding ones of the plurality of noise contributors execute relative to one another as a function of the predetermined instantaneous current draw threshold and a predetermined priority scheme; and a means for notifying each of the corresponding ones of the plurality of noise contributors to perform the corresponding at least one predefined operation in accordance with the preceding determining step.

BRIEF DESCRIPTION OF THE DRAWINGS

For the purpose of illustrating the disclosure, the drawings show aspects of one or more embodiments of the disclosure. However, it should be understood that the present disclosure is not limited to the precise arrangements and instrumentalities shown in the drawings, wherein.

DETAILED DESCRIPTION

The present invention is directed to a design structure for system architectures for and methods of scheduling on-chip and across-chip noise events. Embodiments of the present disclosure include system architectures for and methods of scheduling on-chip and across-chip active noise events in an integrated circuit, in order to avoid simultaneous active transient noise events. In particular, integrated circuit (IC) system architectures of the disclosure allow for the reduction of on-chip or across-chip transient noise budgets by providing a means to avoid simultaneous high current demand events from at least two functional logic blocks, i.e., noise contributors. For example, each noise contributor monitors internal operations with respect to a pre-determined dI/dt threshold. Prior to performing an offending operation, each noise contributor signals to a noise event arbiter of the intention to create a "noise event," for example, by asserting a "request" line. In one embodiment, the noise event arbiter includes a pre-established dI/dt budget and prioritizes requests from all noise contributors based on the sum of dI/dt from all requesting noise contributors and allows operations to be performed by asserting the respective "grant" signal. In this manner, the noise event arbiter avoids multiple simultaneous high dI/dt events occurring on the IC chip. This, in turn, allows an IC designer to reduce the noise budget for the chip and/or limit the application of known passive noise limitation techniques. This and other examples are described below in more detail.

Figure 1:
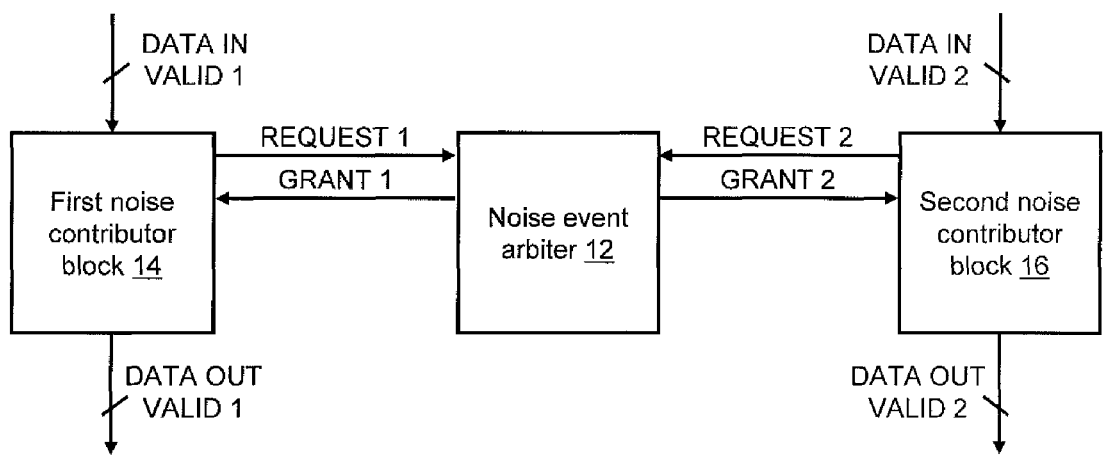
FIG. 1 illustrates a functional block diagram of an IC system architecture in accordance with a first embodiment of the present disclosure for scheduling on-chip noise events.

In accordance with a first embodiment of the present disclosure, FIG. 1 illustrates a functional block diagram of an IC system architecture 10 for scheduling on-chip noise events. IC system architecture 10 includes at least one noise event arbiter 12 and a plurality noise contributors (i.e., aggressors), such as, but not limited to, a first noise contributor block 14 and a second noise contributor block 16. A minimum of two noise contributors is required in order to make an arbitration scheme necessary.

Each noise contributor may be connected to the noise event arbiter via a "request/grant" signal pair. For example, an output of first noise contributor block 14 may be a request signal (REQUEST 1) that may feed an input of noise event arbiter 12, and an output of noise event arbiter 12 may be a corresponding grant signal (GRANT 1) that may feed an input of first noise contributor block 14. Similarly, an output of second noise contributor block 16 may be a request signal (REQUEST 2) that may feed another input of noise event arbiter 12, and another output of noise event arbiter 12 may be a corresponding grant signal (GRANT 2) that may feed an input of second noise contributor block 16. Each request signal (e.g., REQUEST 1 or REQUEST 2) serves as the "request-to-operate" indicator to noise event arbiter 12 and each grant signal (e.g., GRANT 1 or GRANT 2) serves as the "permission-to-operate" indicator to the requesting noise contributor block, for example, block 14 or block 16.

Noise event arbiter 12 may provide an arbitration logic function, which, in general, is a logic function that determines on a prioritized basis which command, device, or communication protocol controls the operating environment. An arbitration logic function of the present disclosure may employ a handshaking mechanism, for example, using the request and grant signals mentioned above. More particularly, noise event arbiter 12 may determine which one or ones of multiple noise contributors (e.g., first noise contributor block 14 or second noise contributor block 16), which are competing for run-time in the operating environment, controls the operating state of the noise contributor(s). In the present example, the handshake mechanism is the REQUEST/GRANT signal pairs. Associated with noise event arbiter 12 may be a pre-programmed priority scheme, which can be stored, for example, in simple on-chip memory (not shown) either internal or external to noise event arbiter 12 that may be used to resolve multiple simultaneous requests-to-operate that the arbiter has determined cannot proceed simultaneously by giving priority to the operation of noise contributor block 14 or noise contributor block 16. More specifically, the pre-programmed priority scheme may be based on a total chip instantaneous dI/dt budget within which internal operations of, for example, first noise contributor block 14 and second noise contributor block 16 are constrained. In one example, the total chip instantaneous dI/dt budget of IC system architecture 10 may be hard-coded or programmed to 100 mA/ns. Alternatively, the dI/dt budget could be set based on other factors, as required by further embodiments of this invention. These factors include, but are not limited to, dI/dt per contributor operation, per unit area, per unit time, etc.

Each noise contributor, such as first noise contributor block 14 and second noise contributor block 16, are IC-specific functional logic blocks that are classified as noise contributors because operations thereof may result in high instantaneous current demands. Typical noise contributing functional logic blocks may include, but are not limited to, processors, content addressable memories (CAMs), high speed static random access memories (SRAMs), and serial links. In particular, any functional logic block that uses a wide address or data bus has the potential to be a high noise contributor. By way of example, a high instantaneous current event (i.e., noise event) may occur when multiple address or data lines of a CAM or SRAM transition from ones to zeros or from zeros to ones, because the simultaneous transition of a large number of bits causes a significant draw on the power plane and, thus, noise is generated.

In order to ensure data integrity, each noise contributor may have associated therewith an input data valid signal and an output data valid signal. For example, first noise contributor block 14 may include a DATA IN VALID 1 and DATA OUT VALID 1 signal, and second noise contributor block 16 may have associated therewith a DATA IN VALID 2 and DATA OUT VALID 2 signal. DATA IN VALID 1 and 2 may be used to indicate that the input data is stable and valid and safe to operate upon. Similarly, DATA OUT VALID 1 and 2 may be used to indicate that the output data is stable and valid and safe to operate upon.

Additionally, each noise contributor, such as first noise contributor block 14 and second noise contributor block 16, may be designed to be self-aware with regard to the amount of dI/dt (i.e., instantaneous current) for each operation that executes therein and whether the dI/dt for a given operation exceeds a predefined threshold. For example, the dI/dt threshold may be some fraction (e.g., ¼, ⅓, ½, ⅔, or ¾) of the hard-coded or programmed total chip instantaneous dI/dt budget of IC system architecture 10. In particular, the dI/dt characteristics and the necessity of issuing a REQUEST may be determined during design and simulation of each noise contributor block. For example, a dI/dt design threshold for each operation may be provided to the IC designer and, as each functional block is designed, each operation thereof is modeled in order to determine whether the dI/dt threshold is crossed. The pre-determined dI/dt threshold may be programmed in on-chip memory that is internal or external to each noise contributor block.

Consequently, each noise contributor may be designed to monitor and identify internal operations that exceed the dI/dt threshold (i.e., identify noise events) and issue a request signal (e.g., REQUEST 1 or 2) to arbiter 12 prior to executing the high-noise-event operation. Arbiter 12, in turn, does not allow the high-noise-event operation to execute until the noise contributor receives a grant signal (e.g., GRANT 1 or 2) from the arbiter in response to its request. In one example, once issued, REQUEST 1 or 2 remains asserted until GRANT 1 or 2, respectively, is received and REQUEST 1 or 2 continues to remain asserted until the corresponding high-noise-event operation is completed, at which time REQUEST 1 or 2 is deactivated. Each noise contributor, such as first noise contributor block 14 and second noise contributor block 16, may include an internal state machine that enables them to operate in conjunction with noise event arbiter 12 via the REQUEST/GRANT signal pairs.

By way of illustration, the dI/dt design threshold for both first noise contributor block 14 and second noise contributor block 16 may be, for example, ¾ of the hard-coded or programmed total chip dI/dt budget of IC system architecture 10. Consequently, due to the priority scheme of noise event arbiter 12, first noise contributor block 14 and second noise contributor block 16 are not allowed to execute simultaneously operations that cause each to issue a request signal (i.e., REQUEST 1 and REQUEST 2) to be issued, in order to ensure that the dI/dt budget of IC system architecture 10 is not exceeded and, thereby, avoid simultaneous active transient noise events. Under these exemplary conditions and referring again to FIG. 1, the operation of IC system architecture 10 that shows how the REQUEST/GRANT signal pairs may be used to facilitate communication between noise event arbiter 12 and multiple noise contributors is as follows.

First noise contributor block 14 and second noise contributor block 16 may continuously monitor their respective internal operations to determine whether any operations that are classified as noise events are pending. If first noise contributor block 14 detects a high-noise-event operation, it asserts REQUEST 1 prior to executing the operation and holds off performing the high-noise-event operation and awaits GRANT 1. Likewise, if second noise contributor block 16 detects a high-noise-event operation, it asserts REQUEST 2 prior to executing the operation and holds off performing the high-noise-event operation and awaits GRANT 2. Concurrently to first noise contributor block 14 and second noise contributor block 16 monitoring their respective internal operations, noise event arbiter 12 is monitoring continuously REQUEST 1 and REQUEST 2. If one request-to-operate signal only, such as REQUEST 1 only or REQUEST 2 only, is received by noise event arbiter 12, noise event arbiter 12 activates immediately a corresponding permission-to-operate signal, such as GRANT 1 that corresponds to REQUEST 1 or GRANT 2 that corresponds to REQUEST 2. In doing so, the requesting noise contributor block (e.g., either first noise contributor block 14 or second noise contributor block 16) is granted immediate permission to execute. Upon completion of the requested operation, DATA OUT VALID 1 or DATA OUT VALID 2 is activated.

However, within IC system architecture 10, if two or more requests-to-operate signals are received concurrently by noise event arbiter 12, such as both REQUEST 1 and REQUEST 2, priority is established by use of noise event arbiter 12, as illustrated by, for example, method 20 (FIG. 2) of scheduling on-chip noise events so as to avoid simultaneous active transient noise events. Method 20 includes, but is not limited to the following steps and is described with reference to IC system architecture 10 of FIG. 1. Additionally, by way of example, method 20 utilizes the example of FIG. 1, wherein the dI/dt design threshold of the noise contributor blocks is ¾ of the hard-coded or programmed total chip instantaneous dI/dt budget of IC system architecture 10. As those skilled in the art will readily appreciate, other methods may be used, depending upon the particular circumstances at issue.

At step 22, a noise event arbiter receives simultaneously multiple requests-to-operate from multiple noise contributors, respectively. For example, first noise contributor block 14 detects that a high instantaneous current operation is pending and issues REQUEST 1 to noise event arbiter 12. Initially, no other request-to-operate conditions are present and, thus, noise event arbiter 12 activates immediately GRANT 1 and first noise contributor block 14 is granted permission-to-operate and REQUEST 1 and GRANT 1 are held active during the execution of the requesting operation. However, during the time that REQUEST 1 from first noise contributor block 14 is active, second noise contributor block 16 also detects that a high instantaneous current operation is pending and issues REQUEST 2 to noise event arbiter 12.

At step 24, the noise event arbiter determines when each noise contributor may execute operations, based on an instantaneous current draw threshold and a pre-determined priority scheme. More specifically, by use of noise event arbiter 12, internal operations of two or more noise contributors are granted permission to operate simultaneously when the dI/dt sum of the requesting noise contributors is less than or equal to the total chip instantaneous dI/dt budget of IC system architecture 10. When the sum of dI/dt of multiple simultaneous requests-to-operate exceeds the total chip instantaneous dI/dt budget, certain requesting noise contributors are held off until a suitable portion of the total chip instantaneous dI/dt budget becomes available. For example and continuing the example scenario that is described in step 22, noise event arbiter 12 detects the presence of both REQUEST 1 and REQUEST 2 and determines that the sum of dI/dt when both operations execute simultaneously exceeds the hard-coded or programmed dI/dt budget of IC system architecture 10 and, thus, does not activate immediately GRANT 2, thereby holding off second noise contributor block 16.

At step 26, noise event arbiter 12 notifies each noise contributor as to when permission is granted to execute its operations. For example and continuing the example scenario that is described in steps 22 and 24, once the operations of first noise contributor block 14 are complete, DATA OUT VALID 1 is activated and REQUEST 1 is deactivated, which frees noise event arbiter 12 to deactivate GRANT 1 and activate GRANT 2. In doing so, second noise contributor block 16 is notified as to permission-to-operate. In turn, if REQUEST 1 were to reoccur while REQUEST 2 is active, first noise contributor block 14 is held off (i.e., GRANT 1 is held off) until second noise contributor block 16 completes its operation, and so on.

Figure 2:
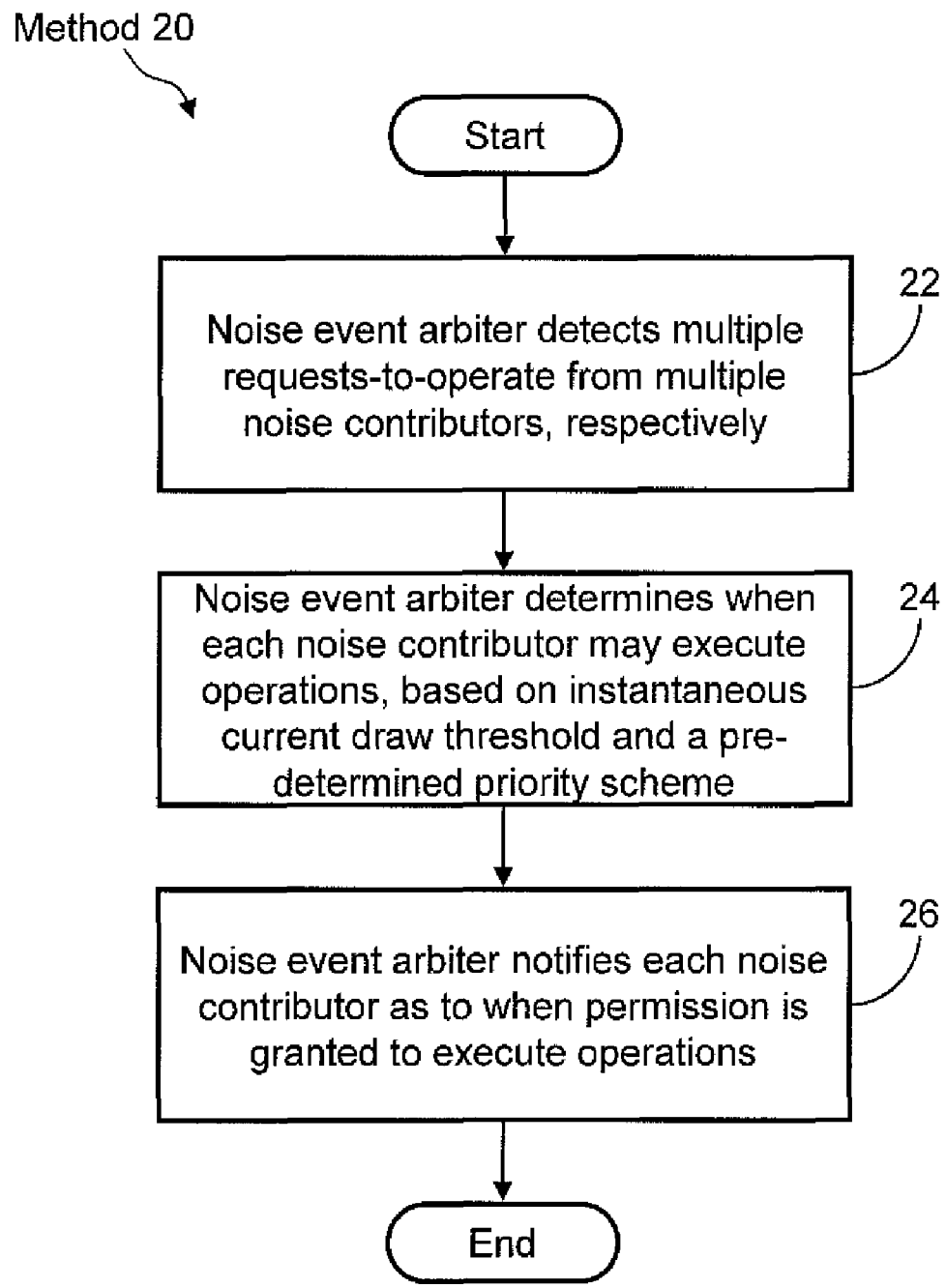
FIG. 2 illustrates, in accordance with a second embodiment of the present disclosure, a flow diagram of a method of scheduling on-chip noise events in order to avoid simultaneous active transient noise events.

With continuing reference to FIGS. 1 and 2, it is noted that internal operations within the multiple noise contributors, such as first noise contributor block 14 and second noise contributor block 16, that do not exceed their respective dI/dt thresholds are allowed to execute freely and simultaneously without the need for arbitration. Additionally, the noise event scheduling operations of noise event arbiter 12 of IC system architecture 10 and described in method 20 is not limited to two noise contributor blocks, the sum of dI/dt from any number of noise contributor blocks may be calculated in order to determine the scheduling of noise contributing operations.

It is noted that in the foregoing description the overall dI/dt threshold is known to event arbiter 12 and used by the arbiter in the predetermined priority scheme. This need not be so. In alternative embodiments no dI/dt threshold need be known at event arbiter 12. For example, each noise contributor, e.g., each noise contributor block 14, 16, may monitor its own operations and assert a REQUEST signal when it recognizes that an operation would exceed a predetermined dI/dt threshold. In this case, event arbiter 12 may assume that all requests are for operations that consume the entire noise budget for the chip, or a region thereof, i.e., operations that exceed the dI/dt budget. In this case, multiple requests are arbitrated simply based on a predetermined priority scheme, without consideration of the dI/dt threshold at event arbiter 12.

Figure 3:
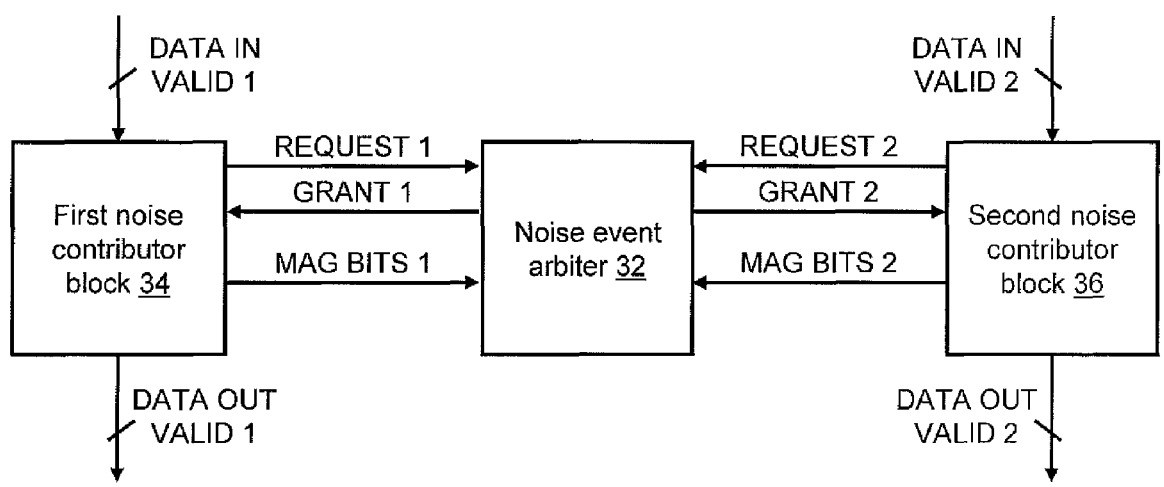
FIG. 3 illustrates a functional block diagram of an IC system architecture in accordance with a third embodiment of the present disclosure that includes a noise event magnitude indicator for scheduling on-chip noise events.

FIG. 3 illustrates a functional block diagram of an IC system architecture 30, in accordance with a third embodiment of the disclosure, that includes a noise event magnitude indicator for scheduling on-chip noise events. For convenience, IC system architecture 30 is substantially identical to IC system architecture 10 of FIG. 1, except that in FIG. 3 noise event arbiter 32 has the ability to utilize the magnitudes of noise events in its arbitration scheme. IC system architecture 30 may also include a plurality noise contributors (i.e., aggressors), such as, but not limited to, a first noise contributor block 34 and a second noise contributor block 36. Noise event arbiter 32, first noise contributor block 34, and second noise contributor block 36 may be substantially identical to noise event arbiter 12, first noise contributor block 14, and second noise contributor block 16, respectively, which are described above in connection with FIGS. 1 and 2. However, first noise contributor block 34 and second noise contributor block 36 of IC system architecture 30 each further includes a noise event magnitude indicator, e.g., a set of magnitude bits (MAG BITS 1 and MAG BITS 2, respectively). In addition to processing requests-to-operate, noise event arbiter 32 may process the magnitude information of MAG BITS 1 and MAG BITS 2 when establishing priority.

The number of MAG BITS is variable and depends on the desired magnitude granularity of IC system architecture 30. The granularity of MAG BITS may be, for example, but not limited to, a function of the hard-coded or programmed total chip instantaneous dI/dt budget of IC system architecture 30. For example, a 1-bit binary bus may indicate two noise event magnitude levels (e.g., ½ dI/dt budget and entirety of dI/dt budget), a 2-bit binary bus may indicate four levels (e.g., ¼, ½, ¾, and entirety of dI/dt budget), a 4-bit binary bus may indicate eight levels (e.g., ⅛, ⅔, ⅜, ⅘, ⅝, ⅞, ⅞, and entirety of dI/dt budget), and so on. The dI/dt magnitude values may be predetermined during the design and simulation phase of each noise contributor block for each operation therein. As an example, using two binary MAG BITS and a noise contributor block that includes, for example, a wide address or data bus, MAG BITS are set to 00 when one quarter of the bus is rolling over, 01 when one half of the bus is rolling over, 10 when three quarters of the bus is rolling over, and 11 when the entire bus is rolling over, which indicates noise event magnitude levels of, for example, 00=¼ of dI/dt budget, 01=½ of dI/dt budget, 10=¾ of dI/dt budget, and 11=entirety of dI/dt budget, respectively.

In this scenario, while noise event arbiter 32 is continuously monitoring and processing requests-to-operate from multiple noise contributor blocks as described with reference to noise event arbiter 12 of FIGS. 1 and 2, noise event arbiter 32 is also continuously monitoring and summing the dI/dt as indicated by the noise event magnitude bits of each noise contributor block and issuing or holding off GRANTS based on whether the sum of dI/dt of all simultaneously requesting noise contributor blocks is less than, equal to, or greater than the hard-coded or programmed total chip instantaneous dI/dt budget of IC system architecture 30.

Again, using the example of two binary MAG BITS and wherein 00=¼ of dI/dt budget, 01=½ of dI/dt budget, 10=¾ of dI/dt budget, and 11=entirety of dI/dt budget, the operation of IC system architecture 30 may be as follows. In a first example, noise event arbiter 32 may grant simultaneous permissions-to-operate to four noise contributor blocks that each have MAG BITS=00 and hold off any additional simultaneous permissions-to-operate of any magnitude. In another example, noise event arbiter 32 may grant simultaneous permissions-to-operate to two noise contributor blocks that each have MAG BITS=00 and one noise contributor block that has MAG BITS=01 and hold off any additional simultaneous requests/permissions-to-operate of any magnitude. In yet another example, noise event arbiter 32 may grant simultaneous permissions-to-operate to two noise contributor blocks that each have MAG BITS=01 and hold off any additional simultaneous requests/permissions-to-operate of any magnitude. In yet another example, noise event arbiter 32 may grant simultaneous permissions-to-operate to one noise contributor block that has MAG BITS=00 and one noise contributor block that has MAG BITS=10 and hold off any additional simultaneous requests/permissions-to-operate of any magnitude. In yet another example, noise event arbiter 32 may grant a permission-to-operate to one noise contributor block only that has MAG BITS=11 and hold off any additional simultaneous requests/permissions-to-operate of any magnitude.

Figure 4:
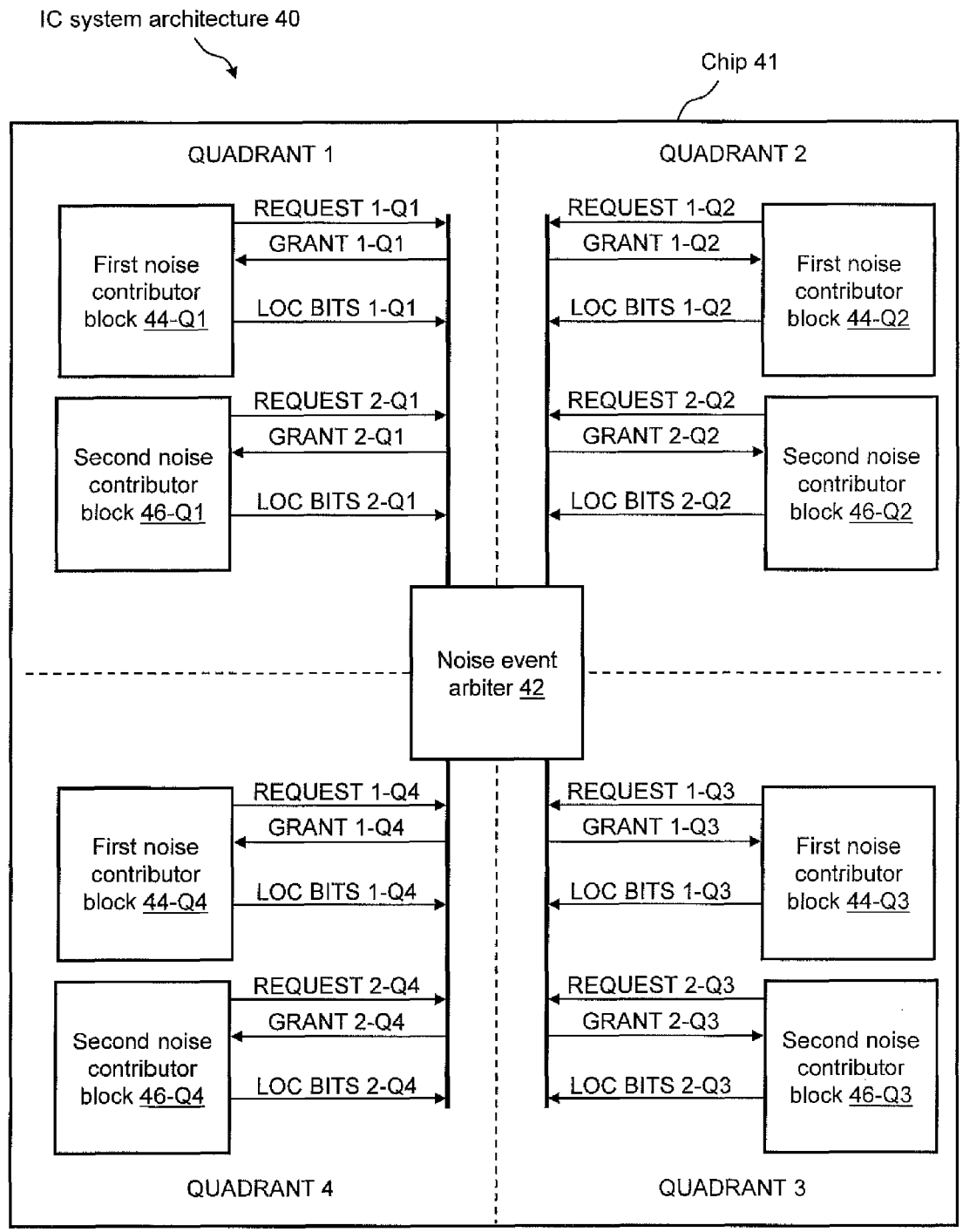
FIG. 4 illustrates a functional block diagram of an IC system architecture in accordance with a fourth embodiment of the present disclosure that includes a spatial location indicator for scheduling across-chip noise events.

FIG. 4 illustrates, in accordance with a fourth embodiment of the present disclosure, a functional block diagram of an IC system architecture 40 having a noise event arbiter 42 that utilizes information about the physical locations of the noise contributors, for example, noise contributor blocks 44-Q1 through 44-Q4 and 46-Q1 through 46-Q4, in scheduling across-chip noise events. IC system architecture 40 may be substantially identical to IC system architecture 10 of FIG. 1 except for this ability. Such physical-location arbitration may be desirable, for example, in managing across-chip noise events because concern for instantaneous noise events may be limited to noise contributor blocks that are physically located in close proximity one to another only. This is so because simultaneous noise events of noise contributor blocks that are sufficiently far apart in distance may not be additive because of sufficient power plane isolation therebetween.

To illustrate the concept of physical-location arbitration in more detail, FIG. 4 shows an IC chip 41 containing IC system architecture 40 divided into, for example, four quadrants, i.e., QUADRANT 1, QUADRANT 2, QUADRANT 3, and QUADRANT 4, and each quadrant contains, for example, two noise contributor blocks, i.e., noise contributor blocks 44-Q1 and 46-Q1, 44-Q2 and 46-Q2, 44-Q3 and 46-Q3, and 44-Q4 and 46-Q4, respectively. In the exemplary configuration of FIG. 4, noise event arbiter 42 operates in common to all noise contributor blocks 44-Q1 through 44-Q4 and second noise contributor blocks 46-Q1 through 46-Q4 of all quadrants, i.e., QUADRANT 1, QUADRANT 2, QUADRANT 3, QUADRANT 4.

Each instance of noise event arbiter 42, first noise contributor blocks 44-Q1 through 44-Q4, and second noise contributor blocks 46-Q1 through 46-Q4 may be substantially identical to noise event arbiter 12, first noise contributor block 14, and second noise contributor block 16, respectively, which are described with reference to FIGS. 1 and 2. However, first noise contributor blocks 44-Q1 through 44-Q4 of IC system architecture 40 of FIG. 4 may be configured so that each asserts a location information signal LOC BITS 1-Q1 through 1-Q4, respectively, that provides arbiter 42 with information about the location of that noise contributor block. Likewise, second noise contributor blocks 46-Q1 through 46-Q4 may be configured so that each asserts a location information signal LOC BITS 2-Q1 through 2-Q4, respectively, that also provides arbiter with information about the location of that noise contributor block. In addition to processing requests-to-operate, noise event arbiter 42 processes the location information that is reflected by LOC BITS 1-Q1 through 1-Q4 and LOC BITS 2-Q1 through 2-Q4 when establishing priority of operation of noise contributor blocks 44-Q1 through 44-Q4 and 46-Q1 through 46-Q4.

The number of bits in the LOC BITS signals is variable and depends on the desired locational granularity of IC system architecture 40, which may be, for example, an arbitrary division of area that is consumed on chip 41 by IC system architecture 40. For example, a 1-bit binary bus may indicate two divisions of area (i.e., two halves), a 2-bit binary bus may indicate four divisions of area (i.e., four quadrants, such as shown in FIG. 4), a 4-bit binary bus may indicate eight divisions of area (i.e., eight octants), and so on. In the example of FIG. 4, which shows four quadrants, i.e., QUADRANTs 1-4, a 2-bit binary bus is appropriate. For example, LOC BITS 1-Q1 of first noise contributor block 44-Q1 of QUADRANT 1 may set to 00, LOC BITS 1-Q2 of first noise contributor block 44-Q2 of QUADRANT 2 may set to 01, LOC BITS 1-Q3 of first noise contributor block 44-Q3 of QUADRANT 3 may be set to 10, and LOC BITS 1-Q4 of first noise contributor block 44-Q4 of QUADRANT 4 may be set to 11.

In operation, the priority within each QUADRANT 1-4 is established independent of the other three quadrants by use of noise event arbiter 42, which is common to all noise contributor blocks 44-Q1 through 44-Q4 and 46-Q1 through 46-Q4. More specifically, noise event arbiter 42 is continuously monitoring and processing requests-to-operate from multiple noise contributor blocks 44-Q1 through 44-Q4 and 46-Q1 through 46-Q4 as described with reference to IC system architecture 10 of FIGS. 1 and 2. Noise event arbiter 42 may also continuously monitor location information signal LOC BITS 1-Q1 through 1-Q4 and LOC BITS 2-Q1 through 2-Q4 of each noise contributor block 44-Q1 through 44-Q4 and 46-Q1 through 46-Q4 and issuing or holding off GRANTS (independently per quadrant) based on requests-to-operate from multiple noise contributor blocks of the same quadrant. In order to make this possible, noise event arbiter 42 may include a separate hard-coded or programmed total instantaneous dI/dt budget for each of QUADRANTs 1, 2, 3, and 4.

Again, using the example of two binary location bits for each location information signal LOC BITS 1-Q1 through 1-Q4, 2-Q1 through 2-Q4, and wherein 00=QUADRANT 1, 01=QUADRANT 2, 10=QUADRANT 3, and 11=QUADRANT 4, the operation of IC system architecture 40 may be as follows. All operations of first noise contributor block 44-Q1 and second noise contributor block 46-Q1 of QUADRANT 1, whose LOC BITS=00, are scheduled as described with reference to IC system architecture 10 of FIGS. 1 and 2, without regard to simultaneous requests-to-operate from noise contributor blocks of QUADRANTs 2, 3, and 4. Likewise, all operations of first noise contributor block 44-Q2 and second noise contributor block 46-Q2 of QUADRANT 2, whose location bits are 01, are scheduled as described with reference to IC system architecture 10 of FIGS. 1 and 2, without regard to simultaneous requests-to-operate from noise contributor blocks of QUADRANTs 1, 3, and 4. Similarly, all operations of first noise contributor block 44-Q3 and second noise contributor block 46-Q3 of QUADRANT 3, whose location bits are 10, are scheduled as described with reference to IC system architecture 10 of FIGS. 1 and 2, without regard to simultaneous requests-to-operate from noise contributor blocks of QUADRANTs 1, 2, and 4. Likewise, all operations of first noise contributor block 44-Q4 and second noise contributor block 46-Q4 of QUADRANT 4, whose location bits 11, are scheduled as described with reference to IC system architecture 10 of FIGS. 1 and 2, without regard to simultaneous requests-to-operate from noise contributor blocks of QUADRANTs 1, 2, and 3.

Alternatively, rather than the location information being hard-coded in each noise contributor block of IC system architecture 40 and disseminated via location bits, the location information of each noise contributor block may be programmed into noise event arbiter 42.

Figure 5:
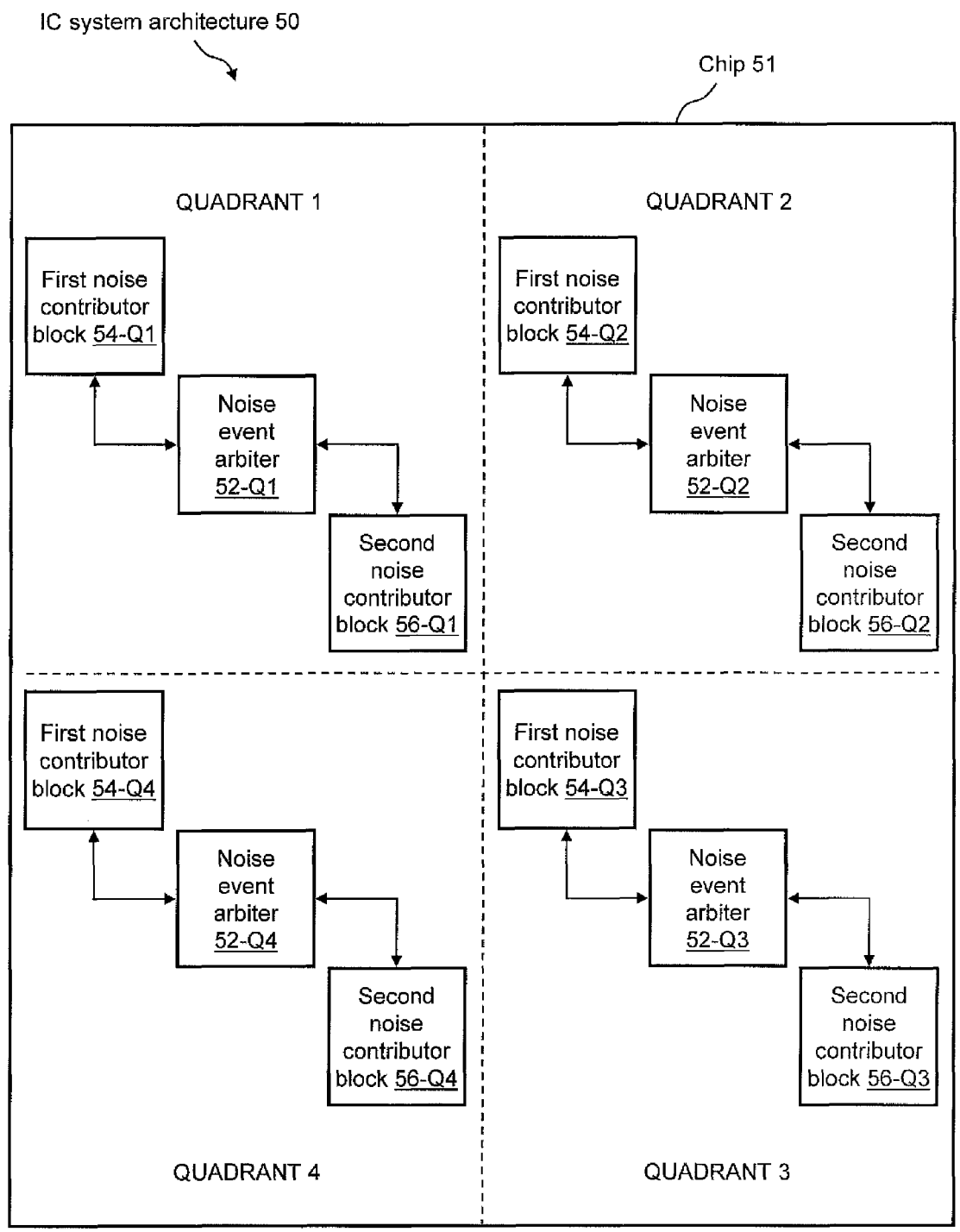
FIG. 5 illustrates a functional block diagram of an IC system architecture in accordance with a fifth embodiment of the present disclosure that includes multiple noise event arbiters for scheduling across-chip noise events.

FIG. 5 illustrates, in accordance with a fifth embodiment of the present disclosure, a functional block diagram of an IC system architecture 50 aboard an IC chip that includes multiple noise event arbiters, in this example four noise even arbiters 52-Q1 through 52-Q4, for scheduling across-chip noise events. As discussed above in connection with FIG. 4, concern for instantaneous noise events may be limited only to noise contributor blocks that are physically located in close proximity to one another. IC system architecture 50 of FIG. 5 provides an alternative to the central arbiter architecture of IC system 40 of FIG. 4 for scheduling such across-chip noise events.

More particularly, FIG. 5 shows that the area consumed by IC system architecture 50 aboard chip 51 may be arbitrarily divided into four quadrants, e.g., QUADRANTs 1-4, as described with reference to IC system architecture 40 of FIG. 4. However, in contrast with IC system architecture 40 of FIG. 4, IC system architecture 50 does not include a noise event arbiter that operates in common to all noise contributor blocks of all quadrants and does not require spatial location indicators. Instead, each of QUADRANTs 1-4 of IC system architecture 50 includes its own corresponding respective noise arbiter 52-Q1 through 52-Q4, each of which may operate independently of the other noise event arbiters within IC system architecture 50.

By way of example, FIG. 5 shows each of QUADRANTs 1-4 as containing corresponding respective noise contributor blocks 54-Q1 through 54-Q4 and 56-Q1 through 56-Q4, each of which may be similar or identical to first noise contributor block 14, and second noise contributor block 16, respectively, which are described with reference to FIGS. 1 and 2. Similarly, each noise event arbiter 52-Q1 through 52-Q4 of FIG. 5 may be similar or identical to noise event arbiter 12 of FIGS. 1 and 2.

Referring still to FIG. 5, because concern for instantaneous noise events within QUADRANT 1 may be limited to noise contributors that are physically located in QUADRANT 1 only, noise event arbiter 52-Q1 schedules the priority of first noise contributor block 54-Q1 and second noise contributor block 56-Q1 only, as described with reference to IC system architecture 10 of FIGS. 1 and 2. Similarly, because concern for instantaneous noise events within QUADRANT 2 may be limited to noise contributors that are physically located in QUADRANT 2 only, noise event arbiter 52-Q2 schedules the priority of first noise contributor block 54-Q2 and second noise contributor block 56-Q2 only, as described with reference to IC system architecture 10 of FIGS. 1 and 2. Likewise, because concern for instantaneous noise events within QUADRANT 3 may be limited to noise contributors that are physically located in QUADRANT 3 only, noise event arbiter 52-Q3 schedules the priority of first noise contributor block 54-Q3 and second noise contributor block 56-Q3 only, as described with reference to IC system architecture 10 of FIGS. 1 and 2. Similarly, because concern for instantaneous noise events within QUADRANT 4 may be limited to noise contributors that are physically located in QUADRANT 4 only, noise event arbiter 52-Q4 schedules the priority of first noise contributor block 54-Q4 and second noise contributor block 56-Q4 only, as described with reference to IC system architecture 10 of FIGS. 1 and 2. In this way, multiple noise event arbiters are utilized for scheduling across-chip noise events.

In another embodiment, the arbitration priority scheme of the noise event arbiter may include a time variable. More specifically, given that noise events are limited in time (e.g., quarter cycle, half cycle, one cycle, two cycles, etc.), the arbitration priority scheme may include duration information, which is used to queue operations (i.e., pack operations closer together in time) when multiple requests-to-operate exist simultaneously. The "duration information" may include time for chip power bus/capacitance charge recovery. For this capability, along with the REQUEST/GRANT signal pair, noise event duration information is provided.

In a further embodiment, the arbitration priority scheme of the noise event arbiter may include history information, which may be used to ensure that a single high priority noise contributor does not monopolize operation. In doing so, it is ensured that all requesting noise contributors are eventually granted permission-to-operate.

In yet another embodiment, the arbitration priority scheme of the noise event arbiter may be dynamically programmable and, thus, is changeable on-the-fly during operation. This embodiment may require an on-chip programmable memory device that is integrated in the arbitration scheme.

In still a further embodiment, the arbitration priority scheme of the noise event arbiter may include priority information. For example, certain noise events of one or more noise contributor blocks may be classified as "top priority." Once granted permission-to-operate, a top priority noise event may not be interrupted. Therefore, all other requests-to-operate are held off until completion of the top priority noise event in its entirety. Additionally, associated with the top priority noise event may be a priority override, i.e., the top priority noise event's request-to-operate overrides all others. Additionally, this override capability could be extended to a high-priority interrupt capability, which would allow the arbiter to de-assert an active GRANT signal (effectively halting the associated noise contributor operation and putting it in a wait state) and assert a different, higher priority GRANT signal in response to a higher priority REQUEST signal.

In still yet other embodiments, the arbitration priority scheme of the noise event arbiter may include any and all combinations of one or more variables, such as, but not limited to, noise event magnitude information, noise contributor location information, noise event duration information, history information, priority information, priority override information, and dynamic programmability. Additionally, those skilled in the art will recognize that method 20 of FIG. 2, which is a method of scheduling on-chip noise events in order to avoid simultaneous active transient noise events, may be modified to include any and all combinations of the above-mentioned variables.

Figure 6:
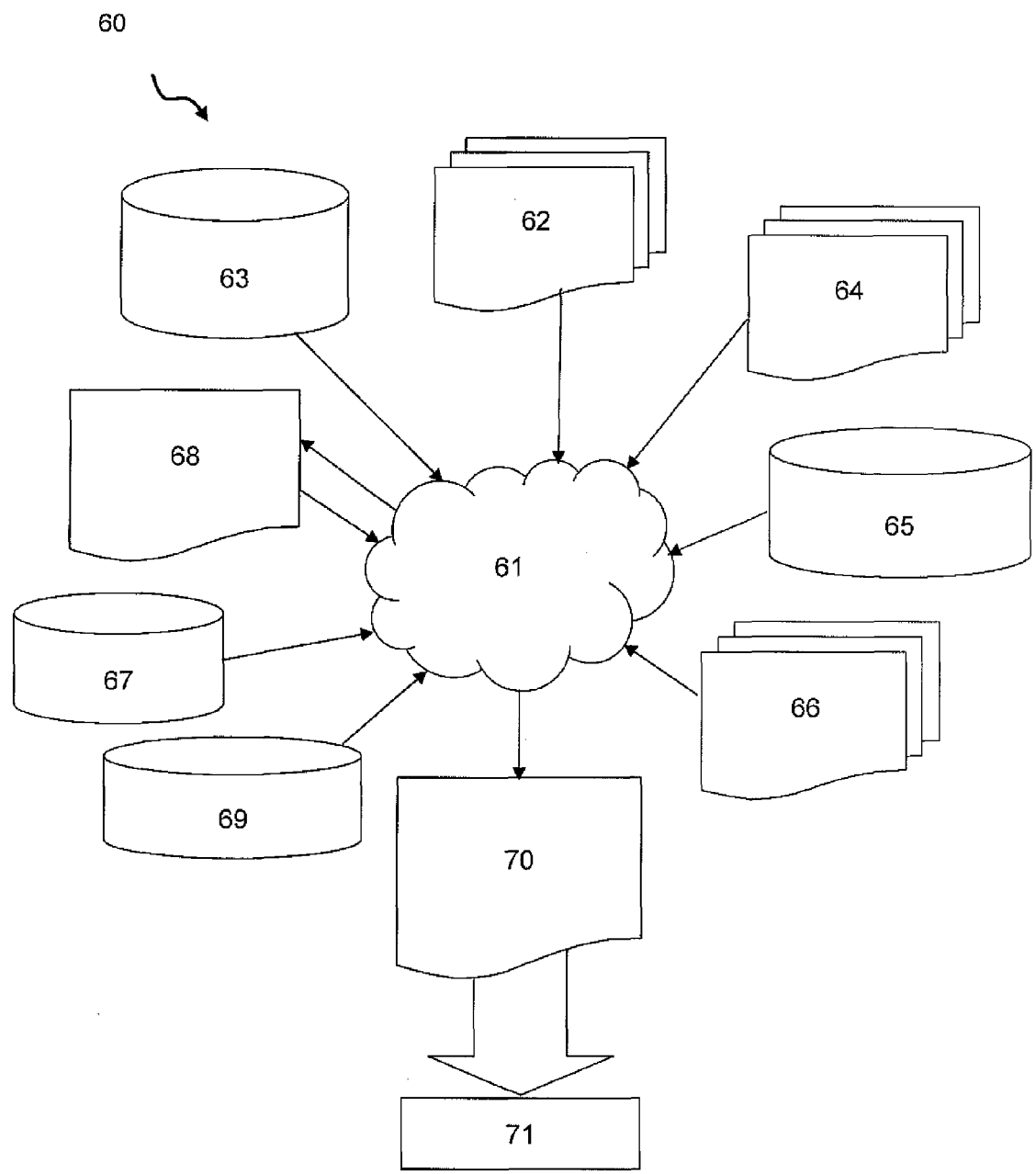
FIG. 6 is a flow diagram of a design process used in semiconductor design, manufacturing, and/or test.

FIG. 6 shows a block diagram of an example design flow 60. Design flow 60 may vary depending on the type of IC being designed. For example, a design flow 60 for building an application specific IC (ASIC) may differ from a design flow 60 for designing a standard component. Design structure 62 is preferably an input to a design process 61 and may come from an IP provider, a core developer, or other design company or may be generated by the operator of the design flow, or from other sources. Design structure 62 comprises circuit 10 in the form of schematics or HDL, a hardware-description language (e.g., Verilog, VHDL, C, etc.). Design structure 62 may be contained on one or more machine readable medium. For example, design structure 62 may be a text file or a graphical representation of circuit 10. Design process 61 preferably synthesizes (or translates) circuit 10 into a netlist 68, where netlist 68 is, for example, a list of wires, transistors, logic gates, control circuits, I/O, models, etc. that describes the connections to other elements and circuits in an integrated circuit design and recorded on at least one of machine readable medium. This may be an iterative process in which netlist 68 is resynthesized one or more times depending on design specifications and parameters for the circuit.

Design process 61 may include using a variety of inputs; for example, inputs from library elements 63 which may house a set of commonly used elements, circuits, and devices, including models, layouts, and symbolic representations, for a given manufacturing technology (e.g., different technology nodes, 32 nm, 45 nm, 90 nm, etc.), design specifications 64, characterization data 65, verification data 66, design rules 67, and test data files 69 (which may include test patterns and other testing information). Design process 61 may further include, for example, standard circuit design processes such as timing analysis, verification, design rule checking, place and route operations, etc. One of ordinary skill in the art of integrated circuit design can appreciate the extent of possible electronic design automation tools and applications used in design process 61 without deviating from the scope and spirit of the invention. The design structure of the invention is not limited to any specific design flow.

Design process 61 preferably translates an embodiment of the invention as shown in FIGS. 1-5, along with any additional integrated circuit design or data (if applicable), into a second design structure 70. Design structure 70 resides on a storage medium in a data format used for the exchange of layout data of integrated circuits (e.g. information stored in a GDSII (GDS2), GL1, OASIS, or any other suitable format for storing such design structures). Storage medium, for the purpose of this disclosure, does not include ephemeral transitory mediums, i.e., signals. Design structure 70 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-5. Design structure 70 may then proceed to a stage 71 where, for example, design structure 70: proceeds to tape-out, is released to manufacturing, is released to a mask house, is sent to another design house, is sent back to the customer, etc. Exemplary embodiments have been disclosed above and illustrated in the accompanying drawings. It will be understood by those skilled in the art that various changes, omissions and additions may be made to that which is specifically disclosed herein without departing from the spirit and scope of the present disclosure.

What is claimed is:

1. A machine readable storage medium containing a design structure in a data format, the design structure, when processed by executing instructions on a machine, is used in a design process for an integrated circuit device, the design structure for said integrated circuit device comprising:

an integrated circuit having a predetermined instantaneous current draw threshold and including:

a first functional block provided to perform at least one first predefined operation and including a first request-to-operate signal generator configured to generate a first request-to-operate signal;

a second functional block provided to perform at least one second predefined operation and including a second request-to-operate signal generator configured to generate a second request-to-operate signal; and a noise arbiter in communication with each of said first functional block and said second functional block, said noise arbiter controlling when each of said first functional block and said second functional block will operate as a function of said first request-to-operate signal, said second request-to-operate signal and said predetermined instantaneous current draw threshold;

wherein said at least one first predefined operation has a duration and said first request-to-operate signal generator is configured so that said first request-to-operate signal includes information identifying said duration.

2. The design structure of claim 1, wherein the design structure comprises a netlist, which describes the circuit.

3. The design structure of claim 1, wherein the design structure resides on storage medium as a data format used for the exchange of layout data of integrated circuits.

4. The design structure of claim 1, wherein the design structure includes at least one of test data files, characterization data, verification data, or design specifications.

5. A machine readable storage medium containing a design structure in a data format, the design structure, when processed by executing instructions on a machine, is used in a design process for circuitry that provides a method of controlling instantaneous current noise in an integrated circuit having a predetermined instantaneous current draw threshold and that includes a plurality of noise contributors each configured to generate a request-to-operate signal and each configured to perform at least one predefined operation, the design structure comprising:

a means for receiving substantially simultaneously a plurality of request-to-operate signals from corresponding ones of the plurality of noise contributors;

a means for determining when ones of the plurality of predefined operations corresponding to said corresponding ones of the plurality of noise contributors execute relative to one another as a function of the pre-determined instantaneous current draw threshold and a pre-determined priority scheme; and a means for notifying each of said corresponding ones of the plurality of noise contributors to perform the corresponding at least one predefined operation in accordance with the preceding determining means;

wherein at least one first predefined operation performed by a corresponding noise contributor has a duration and at least one of the plurality of noise contributors is configured to generate a first request-to-operate signal including information identifying said duration.

* * * * *